(12) United States Patent
Yamada

(10) Patent No.: US 9,119,331 B2
(45) Date of Patent: Aug. 25, 2015

(54) LIGHT EMITTING DEVICE INCLUDING SEALING MEMBERS AND RESIN MEMBER EXTENDING SUBSTANTIALLY PARALLEL TO SEALING MEMBERS

(71) Applicant: NICHIA CORPORATION, Anan-shi, Tokushima (JP)

(72) Inventor: Motokazu Yamada, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/197,560

(22) Filed: Mar. 5, 2014

(65) Prior Publication Data

US 2014/0254182 A1  Sep. 11, 2014

(30) Foreign Application Priority Data

Mar. 7, 2013  (JP) ................................. 2013-045284

(51) Int. Cl.

| | |
|---|---|
| H01L 29/18 | (2006.01) |
| H01L 33/00 | (2010.01) |
| H05K 3/28 | (2006.01) |
| F21V 19/00 | (2006.01) |
| H01L 27/15 | (2006.01) |
| H05K 1/18 | (2006.01) |
| H05K 3/34 | (2006.01) |

(52) U.S. Cl.
CPC .............. *H05K 3/284* (2013.01); *F21V 19/005* (2013.01); *H01L 27/156* (2013.01); *H05K 1/189* (2013.01); *H05K 3/3436* (2013.01); *H05K 2201/0195* (2013.01); *H05K 2201/09409* (2013.01); *H05K 2201/10106* (2013.01)

(58) Field of Classification Search
CPC ............................ H01L 27/156; F21V 19/005
USPC ....................... 257/88, 99, E33.056, E33.058; 362/249.02, 612, 311.02, 800
See application file for complete search history.

(56) References Cited

U.S. PATENT DOCUMENTS

| | | | | |
|---|---|---|---|---|
| 7,997,771 | B2* | 8/2011 | Epstein et al. ................. | 362/339 |
| 2005/0243576 | A1* | 11/2005 | Park et al. ...................... | 362/612 |
| 2013/0001633 | A1* | 1/2013 | Imai et al. ....................... | 257/99 |

FOREIGN PATENT DOCUMENTS

| | | |
|---|---|---|
| JP | 2011-228602 A | 11/2011 |
| JP | 2012-059736 A | 3/2012 |

\* cited by examiner

*Primary Examiner* — Robert Huber
(74) *Attorney, Agent, or Firm* — Global IP Counselors, LLP

(57) ABSTRACT

A light emitting device which can prevent bending of the substrate member. The light emitting device includes a flexible substrate member, a plurality of light emitting elements, two first sealing members, and a second sealing member. The two first sealing members are disposed in-line on the substrate member and arranged in the longitudinal direction. The second sealing member is arranged extending in the longitudinal direction on the substrate member, and is offset in a lateral direction from the two first sealing members. The second sealing member is further arranged to extend across a first gap formed between the two first sealing members when viewed from a lateral direction, and overlap at least a portion of each of the two first sealing members. The second sealing member comprises a resin having transparency to light.

20 Claims, 2 Drawing Sheets

LIGHT EMITTING DEVICE INCLUDING SEALING MEMBERS AND RESIN MEMBER EXTENDING SUBSTANTIALLY PARALLEL TO SEALING MEMBERS

CROSS-REFERENCE TO RELATED APPLICATION

This application claims priority to Japanese Patent Application No. 2013-045284, filed on Mar. 7, 2013. The entire disclosure of Japanese Patent Application No. 2013-045284 is hereby incorporated herein by reference.

BACKGROUND

1. Technical Field

The present disclosure relates to a light emitting device.

2. Background Art

There has been known a light emitting device which includes a plurality of sealing members disposed on a flexible substrate member (Japanese Patent Publication: JP2011-228602A). The plurality of sealing members respectively seals light emitting elements. In Patent Literature 1: JP2011-228602A, roll-to-roll processing is employed, in which, while pulling out a roll of a flexible substrate member, light emitting elements are arranged on the flexible substrate member, and then re-reeling the flexible substrate member after arranging them. Such a light emitting device wound in its longitudinal direction can facilitate handling at the time of storage or transportation.

SUMMARY

A light emitting device which can prevent bending of the substrate member. The light emitting device includes a flexible substrate member, a plurality of light emitting elements, two first sealing members, and a second sealing member. The two first sealing members are disposed in-line on the substrate member and arranged in the longitudinal direction. The second sealing member is arranged extending in the longitudinal direction on the substrate member, and is offset in a lateral direction from the two first sealing members. The second sealing member is further arranged to extend across a first gap formed between the two first sealing members when viewed from a lateral direction, and overlap at least a portion of each of the two first sealing members. The second sealing member comprises a resin having transparency to light.

DETAILED DESCRIPTION

Figure 1:
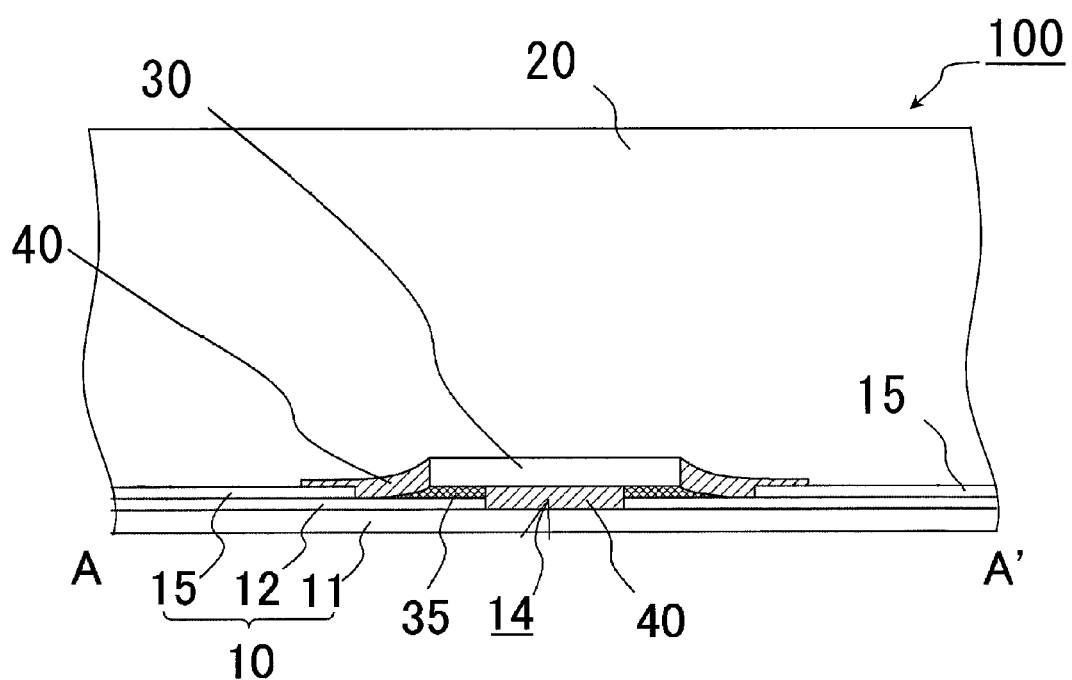
FIG. 1 is a schematic cross-sectional view of a light emitting device according to an embodiment of the present invention shown in FIG. 2, taken along line A-A'.

A light emitting device according to the present disclosure includes mainly, a substrate member, a light emitting element, and a sealing member.

Substrate Member

The substrate member includes at least a base member, a plurality of wiring portions disposed on the base member, and a covering layer disposed on the wiring portions.

The base member is a member to serve as a base of the light emitting device and has flexibility. As long as the flexibility can be maintained, the base member can be formed by using an appropriate material according to the purpose and applications, and also in view of mounting of the light emitting element, the reflectance, adhesiveness with other members. Examples of such material include an insulating or conductive material such as plastic and metal foil. More specifically, a resin such as polyethylene terephthalate and polyimide may be preferably used. Particularly, in the case where solder is used for mounting light emitting elements, polyimide, which has high heat resistance, is more preferably used. In addition, a material having high optical reflectance (for example, a white filler such as titanium oxide) may be contained in the material constituting the base member.

The thickness of the base member can be in a range so as not to impair the flexibility, and for example, the thickness of about 10 μm to 500 μm can be employed, and about 10 μm to 200 μm or further about 10 μm to 100 μm is preferable.

The base member can be made with an appropriate shape (size, length, width) according to the aim and applications. The base member substantially defines the shape of the substrate member, and the example of the shape include a quadrangular shape, a rectangular shape, a polygonal shape, a circular shape, an elliptical shape, or a shape which is a combination of these shapes. In the case where the light emitting device according to an embodiment of the present invention is used for straight tube-type lighting equipment, an elongated shape extending in the longitudinal direction can be preferably employed. For example, the ratio in the longitudinal direction to the lateral direction can be about 5 to 200:1, and about 5 to 100:1, about 10 to 30:1 or about 10 to 20:1 is more preferable. A flexible base member can be used in a deformed state such as in a curved or bent state. Therefore, in the case where one light emitting device to be arranged, the flexible base member having a width and length several mm to several cm larger than the width and length of the housing member of the device can be used. Also, even in the case where a plurality of light emitting devices are to be arranged, the outermost periphery of the devices can be about several mm to several cm larger than the housing member of the devices.

For example, in the case of light source for straight tube-type lighting, more specifically, in the case of a straight tube-type lighting of about 120 cm in length (a 40-type), one light emitting device employing a base member of 0.5 cm to 5 cm in width and 100 cm to 150 cm in length can be used, or a plurality of light emitting devices each employing a base member of 0.5 cm to 5 cm in width and 20 cm to 70 cm in length can be used.

For the backlight light source for liquid crystal display televisions, an appropriate shape (size, length, and width) can be employed corresponding to the size (the number of inches) of the liquid crystal panel to be used. For example, in the case where the light emitting device is used for the backlight of a 55-inch liquid crystal display television in direct illumination-type application, 15 base members each having a width of 80 mm and a length of 680 mm may be employed, or 30 base members each having a width of 40 mm and a length of 680 mm may be employed.

In a similar manner, in the case where the light emitting device is used for the backlight of a 55-inch liquid crystal display television in edge-type application, 4 base members each having a width of 3 mm to 20 mm and a length of 340 mm may be employed, or 2 base members each having a width of 3 mm to 20 mm and a length of 680 mm may be employed.

The flexible base member can be manufactured by using roll-to-roll method, in which several units of such an elongated base member (substrate member) can be processed together. In this case, sprocket holes may be formed in the base member.

A plurality of wiring portions are formed as electrically conductive members, disposed on one surface of the base member and directly or indirectly connected to the light emitting element. The wiring portions may be made of an electrically conductive thin layer having a single-layer structure or a stacked-layer structure of metal such as copper or aluminum or alloy thereof. The wiring portion may be arranged not only on a single surface of the base member, but also an inner side or on another surface of the substrate member according to the type of the substrate member.

It is preferable that the wiring portions have a thickness which does not impair their flexibility and, for example, a thickness of 8 µm to 150 µm can be employed.

The shape (pattern) of the plurality of wiring portions is not specifically limited, and generally, a similar shape or a shape conforming to the shape or pattern of the wiring of the substrate members etc., for mounting the light emitting elements, or for connecting to the light emitting elements, further, in consideration of heat dissipation and/or mechanical strength can be preferably employed. For example, a crank shape; a polygonal shape such as a triangular shape, and a quadrangular shape; a shape with no sharp corners such as a circular shape and an elliptical shape; and a shape of those with partially irregular shape can be employed singly or in combination. The corners of the wiring portions are preferably rounded.

The plurality of wiring portions are arranged spaced apart from each other. Such terminal portions are made up of a pair of positive and negative terminals, and the number of the wiring portions which constitute the pair of the terminals is not specifically limited. For example, each of the pair of wiring portions may be made up of a single wiring portion or a plurality of wiring portions.

Arranging the wiring portions in a relatively large area with a combination of wiring portions having various shapes can increase the degree of freedom in arrangement of the light emitting device. For example, with a rectangular base member, it can be possible that six light emitting elements are arranged three in the longitudinal direction and two in the lateral direction as one block and connected in parallel, then, twelve blocks are arranged in the longitudinal direction and connected in series by the pair of positive and negative wiring portions. It may be such that the base member has an approximately square shape, an approximately circular shape, or standard positive and negative wiring portions respectively.

In addition to the wiring portions directly or indirectly electrically connected to corresponding light emitting elements (that is, the wiring portions for providing electrical continuity), a wiring portion which has a similar shape or a different shape and does not contribute to conduction of electricity and may also be arranged. The wiring portion which does not contribute to providing electrical continuity can serve as a heat releasing member or a mounting portion for the light emitting element. For example, in the case where the base member has an elongated shape extended in the longitudinal direction, the wiring portions which do not contribute to providing electrical continuity are preferably arranged extended to the longitudinal end portions and at the both sides of the wiring portions in the lateral direction. The wiring portions preferably have terminals which respectively allow supply of electricity to the wiring portions. This arrangement allows supply of electricity to light emitting elements from external power source.

In the case where a part of such wiring portions are arranged on approximately the entire surface of the flexible base member (preferably arranged without having a gap), stress due to bending of the substrate member etc., loaded on the light emitting elements and the sealing member to be described later can be reduced. More specifically, in the case where a base member of elongated shape extending in its longitudinal direction is used, the wiring portions are preferably arranged extending in the longitudinal direction, and more preferably, the wiring portions are arranged with a length of ⅓ to 1 of the longitudinal length of the base member.

As described above, on one surface of the base member, the plurality of wiring portions are spaced apart from each other and the separation creates grooves where the wiring portions are not disposed (in other words, portions where the base member is exposed). The grooves are arranged between the wiring portions, so that the shapes of the grooves are in conformity to the shapes of the wiring portions, which may be, for example, a crank shape. The width of the grooves is preferably narrower than the width of the wiring portions, in other words, the wiring portions are preferably provided with a large area, and for example, a width of about 0.05 mm to 5 mm may be employed.

The wiring portions (both wiring portions that contribute to electrical continuity and wiring portions that not contribute to electrical continuity) are preferably arranged on the base member respectively with the largest possible area, so that heat dissipation can be improved.

Further, in the case where the a flexible substrate member is used, because the wiring portions are arranged on the whole area of one surface of the base member with relatively large areas, appropriate strength can be added while maintaining its flexibility. Thus, disconnection of wiring portions and breakage of substrate member due to bending of the flexible substrate member can be prevented effectively. More specifically, with respect to the area of the main surface of the base member, the wiring portions are arranged with an area preferably 50% or greater, more preferably 70% or greater, further preferably 80% or greater, 85% or greater, or 90% or greater. Also, in the case where electrical isolation is needed between the wiring portions, in order to secure the isolation, the wiring portions are preferably disposed with the areas of about 99% or less, about 98% or less, or about 95% or less.

The covering layer covering the wiring portions preferably can serve as a reflective layer to reflect the light emitted from the light emitting element. It is preferable that the covering layer has, as described later, an opening where the wiring portions are exposed, and except for the opening, the covering portion covers approximately the entire surface of the substrate member. In addition, it is preferable that the covering portion also covers the grooves between the wiring portions.

In order to connect the light emitting element with a pair of positive and negative wiring portions, the opening is arranged to expose the wiring portions. The shape and size of the opening is not specifically limited, but a minimum size sufficient for electrical connection of the light emitting element with the wiring portions is preferable.

The number of the openings provided for one substrate member is not specifically limited and for example, appropriately determined according to the number of the light emitting elements to be mounted on one substrate member.

Generally, the number and arrangement of light emitting elements are adjusted according to the output power, light distribution, or the like, and accordingly, the number and the positions of the openings are determined. The number of the openings can either be the same or different with respect to the number of the light emitting elements to be mounted. For example, in the case where twenty light emitting elements to be mounted with one light emitting element in one opening, 20 openings can be arranged in the covering layer. Or in the case where two or more light emitting elements to be mounted in one opening, 10 or less openings can be arranged.

In some cases, the light emitting elements may not be mounted in the openings. For example, in the case where the light emitting devices are manufactured in several ranks (for example, light emitting devices of different outputs), with the use of the same type of the substrate member (that is, the number and arrangement of the openings provided in the covering layer), different optical output can be obtained by changing the number of the light emitting elements to be mounted in the openings. In this case, some openings may not have any light emitting elements mounted therein. A region lacking the covering layer (i.e. an opening) may be formed in a region for arranging a member or the like, such as the terminal described above, which supplies electricity to the light emitting elements.

In the case of flip-chip mounting, a part of groove is preferably exposed in a single opening.

The covering layer can be formed by using a resin such as a phenol resin, an epoxy resin, a BT resin, a PPA, a silicone resin or a urea resin. Also, the covering layer is preferably made of a material which reflects emission of the light emitting element and wavelength-converted light by a wavelength converting member to be described later. For this reason, a filler such as $SiO_2$, $TiO_2$, $Al_2O_3$, $ZrO_2$, or MgO is preferably contained in the resin described above.

The covering layer is preferably disposed with a relatively small thickness, and particularly preferable that the covering layer is disposed so that the upper surface of the light emitting element is higher than the covering layer. More specifically, the thickness of the covering layer may be about 5 μm to 50 μm.

The substrate member having such a structure has flexibility. This arrangement allows its use in various applications, with in situ shape with the light emitting element mounted thereon or with a shape appropriately changed. The total thickness of the substrate member can be adjusted according to the thickness of each of the components described above, and for example, about 0.05 to 0.15 mm, preferably about 0.07 to 0.12 mm can be employed. The substrate member may be formed by stacking the base member, the wiring portions, and the covering layer which are described above with applying an adhesive agent etc. (for example, a silicone-based adhesive agent, an epoxy-based adhesive agent, or an acrylic-based adhesive agent, with a thickness of several micrometers to several tens of micrometers) between them, or by stacking them with the use of plating, thermal compression, or the like.

The weight of the substrate member can be appropriately adjusted according to the materials and thickness of the base member, the wiring portions, and the covering layer, and the size and number of the openings, and for example, a weight of 0.1 $g/cm^2$ or less, 0.09 $g/cm^2$ or less, 0.08 $g/cm^2$ or less, 0.07 $g/cm^2$ or less, is preferably employed. Accordingly, even with an addition of the weight of the light emitting elements etc., to be mounted on the substrate member, a light emitting device of very light weight can be realized.

Light Emitting Element

A plurality of light emitting elements are arranged on the substrate member, with electrically connected to the wiring portions which are exposed from the covering layer. Particularly, in the above-described openings of the covering layer on the substrate member, the light emitting elements are preferably arranged respectively on the two wiring portions in a bridged manner or arranged on a single wiring portion. With such arrangements, the light emitting elements can be electrically connected easily to the pair of positive and negative wiring portions respectively.

The number and/or tone of color tone and/or arrangement of a plurality of light emitting elements are determined to satisfy the output and light distribution designed for the light emitting device. The plurality of light emitting elements may be arranged in two or more rows along the longitudinal direction. That is, the plurality of light emitting elements may include a first group of light emitting elements arranged along the longitudinal direction, and a second group of light emitting elements respectively arranged to the sides of the first group of light emitting elements. It is therefore accordingly the shape and arrangement of the wiring portions and/or openings of the covering layer are adjusted and the light emitting elements are mounted at the determined positions.

The light emitting element includes a semiconductor structure, a p-side electrode, and an n-side electrode.

The semiconductor structure, for example, includes an n-type layer, an active layer, and a p-type layer respectively made of a gallium nitride-based semiconductor and stacked in the order on a light-transmissive sapphire substrate. It is not limited to a gallium nitride-based semiconductor, but also, a group II-VI-based semiconductor or a group III-V-based semiconductor may be used.

The n-side electrode and the p-side electrode can be formed with a single layer or staked-layer of known materials.

The light emitting element may be mounted on the substrate member in a flip-chip manner or a face-up manner.

In the case of flip-chip mounting, the p-side electrode and the n-side electrode of the light emitting element are connected to a pair of wiring portions via a pair of bonding member respectively. For the bonding member, for example, a solder of Sn—Ag—Cu-based, Sn—Cu-based, or an Au—Sn-based, or a metal bump such as Au can be used.

In the case of face-up mounting, the light emitting element is fixed on the base member (on the wiring portion) by an insulating bonding member such as a resin or by an electrically conductive bonding member as described above, and then, electrically connected to the wiring portions via wires. In the case where the substrate member of the light emitting element is electrically conductive, the light emitting element is electrically connected by the bonding member as described above.

In addition to the light emitting elements, an electrical component (including the protective element and the related components describe above) may be arranged on one surface of the substrate member. Such an electrical component may be arranged together with the light emitting element in the opening where the light emitting element is mounted or in a different opening provided separately. But, the electrical component is preferably arranged at a location so as not to absorb much light from the light emitting element. The protective element is preferably arranged at an appropriate position, for example, one protective element is mounted on a wiring portion, to which a plurality of light emitting elements are connected in series, at a position near a connector regardless of the arrangement of the light emitting elements.

The brightness of the light emitting elements can be adjusted by the structure, the constituent materials, the applied voltage, or the like. Also, the brightness of the light emitting device itself can be adjusted by increasing or decreasing the number of the light emitting elements. Thus, in the case of a straight-tube-type (40 W type) light source for lighting, the light emitting device according to the embodiments of the present invention can realize a total brightness of the light emitting elements 2,400 lm or greater at a color temperature of 5,000K, by appropriately adjusting the type and/or the number of the light emitting elements. Accordingly, while maintaining equivalent or greater performance than the fluorescent lamps of various types such as straight-tube types, circular types, and compact types that have been conventionally used, the light emitting devices of the invention can offer smaller size and weight, and can be used in various application sites or locations or conformations.

Also, in the case of a light source for backlight for a 55-inch display, the total brightness of the light emitting elements can realize 9,000 lm or greater at a color temperature of 20,000 K. Accordingly, the degree of freedom can be further expanded compared to that of the LED modules in which LEDs are mounted on a rigid substrate member made of such as glass epoxy, or further, compared to that of the conventional fluorescent lamps and cold-cathode tubes, and thus applications at various sites, locations and conformations which can not be realized in the conventional fluorescent lamps etc., become possible.

For example, the number (density) of the light emitting elements in one light emitting device can be 0.05 to 10 light emitting elements/cm$^2$. With the use of the substrate member described above, appropriate adjustments of the strength for the light emitting elements, heat dissipation of the light emitting element, supply of electricity, etc., become possible, so that such a density of the light emitting elements can be realized.

Resin Layer

The resin layer may be disposed laterally (outer periphery) to the light emitting element, for example, in the openings formed in the covering layer, outer periphery of the openings, or from the inner side of the openings toward the outer periphery of the openings, that is, extending onto the covering layer.

Also, regardless of the presence of the wiring portions, the resin layer may be disposed, for example, in the groove between the wiring portions and/or directly under the light emitting element.

The resin layer is preferably in contact with the outer edge (side surfaces) of the light emitting element. Generally, the light emitting element is mounted on the substrate member by using a bonding member etc., but a part of the surfaces of the bonding member and/or the base member (for example, the wiring portions etc.,) generally tends to develop deterioration due to light than in the material of the resin layer. For this reason, the resin layer is preferably arranged so that in the vicinity of the light emitting element, a part of the surface etc., of the bonding member and/or the base member is covered with the resin layer. With this arrangement, the relatively intense light emitted from the light emitting element can be prevented from directly irradiating the bonding member and/or the base member, so that optical degradation of the constituent members of the light emitting device can be efficiently prevented.

The end portion of the resin layer at the opposite side of the light emitting element may be located either at an inner side of the outer edge, in conformity to the outer edge, or at an outer side of the outer edge of the sealing member to be described below. Of those, it is preferable to dispose the end portion of the resin layer approximately in conformity to the outer edge, or at an outer side of the outer edge of the sealing member. With this arrangement, the contact area between the resin layer and the sealing member can be easily secured, so that the sealing member can be adhered more tightly to the light emitting device, particularly to the resin layer.

In other words, the size of the resin layer, that is, the planar dimension of the light emitting device in light extracting direction may be similar, larger, or smaller than the planar dimension of the sealing member, excluding the planar dimension of the light emitting element. Particularly, the size of the resin layer may be about ⅕ to 3 times, preferably about ¼ to 3 times, and more preferably ⅓ to 1.5 times of the plane area of the sealing resin member excluding the plane area of the light emitting element. Thus, with a large planar dimension of the resin layer, the contact area with the sealing member increases as described later, so that due to the adhesion of both, the adhesion of the sealing member of the light emitting device can be further enhanced.

The resin layer may be disposed, for example, with a thickness in a range of about several micrometers to several hundred micrometers. Particularly, portions in contact with the light emitting element preferably have a thickness corresponding to or less than the height of the side surfaces of the light emitting element. In the case where the resin layer is disposed in the whole portion of the opening, the portion in contact with the periphery of the opening preferably has a thickness not exceeding the depth of the opening. Preferably the thickness of the first resin member decreases from the light emitting element outward (outer side with respect to the canter of the light emitting element).

The resin layer can be formed for example by using a resin having its base polymer of, a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins. Of those, a resin containing a silicone resin, an epoxy resin, or the like as its base polymer is preferable. In the specification, the term "a base polymer" means a resin having a highest content of the materials constituting the resin layer. The resin layer preferably contains, for example, a reflective material and/or diffusion material such as $SiO_2$, $TiO_2$, $Al_2O_3$, $ZrO_2$, and MgO. With this arrangement, light can be reflected sufficiently.

The resin layer may be made of a single material or a combination of two or more materials. With this arrangement, the reflectance of light can be adjusted and also the linear expansion coefficient of the resin can be adjusted.

Particularly, the resin layer is preferably formed, including the same polymer as in the sealing member as described above, more particularly, including the same polymer constituting the base polymer of the resin layer, and more preferably including the same polymer of the base polymer of the sealing member as the base polymer of the resin layer. With this arrangement, at the portion where the sealing member is in contact with the resin layer, suitability and compatibility of the both resin members are preferable, so that the adhesion with the resin layer can be further secured, and strong adhesion of the sealing member in the light emitting device can be realized.

Sealing Member

A plurality of sealing members is arranged in the longitudinal direction on the substrate member. Each of the plurality of sealing members is formed extending along the longitudinal direction.

Any one of the sealing members is formed extending in the longitudinal direction. The sealing member seals one or more light emitting elements of the first group of the light emitting elements described above. The width of the sealing member in the lateral direction is preferably greater than the width of any one of the light emitting elements, but is not limited thereto. The sealing member preferably has a longitudinal length five times or greater than its width, but is not limited thereto. The number of the light emitting elements sealed by the sealing member can be appropriately set, and the number of the light emitting elements may be set for each sealing member. It is preferable that, with the use of a plurality of the sealing members, all the light emitting elements of the first group are covered.

In the case where the resin member to be described below does not seal the second group of light emitting elements, the plurality of sealing members may seal the second group of light emitting elements. In this case, the plurality of sealing members is at least arranged in two rows in the lateral direction.

In the case where grooves described above between the plurality of grooves extend along the lateral direction, the plurality of the sealing member preferably intersects with the grooves in a plan view of the substrate member. With this arrangement, with the use of the sealing members, the substrate member can be prevented from bending.

The plurality of wiring portions is arranged in the longitudinal direction spaced apart from each other. The longitudinal lengths of the gaps formed between the sealing members can be respectively appropriately arranged.

The sealing member preferably has transparency to the light from the light emitting element and light resistance and electrical insulation properties. The sealing member is preferably arranged to cover all the openings of the covering layer described above, but may be arranged not to cover some of the openings. In the specification, the term "transparency to light" means properties of transmitting about 60% or greater emission of the light emitting element, more preferably 70% or greater or 80% or greater of light emitted from the light emitting element.

The sealing member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

The sealing member preferably includes a wavelength converting member such as a fluorescent material capable of absorbing light from the light emitting element and emitting light of different wavelength. Examples of such a wavelength converting member include an oxide-based fluorescent material, a sulfide-based fluorescent material, and a nitride-based fluorescent material. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material ($\beta$-sialon-based fluorescent material) to emit green light, and a SCASN-based fluorescent material and a CASN-based fluorescent material to emit red light, are preferably used singly or in combination. Particularly, for the light emitting devices used for the display devices such as backlights of liquid crystal displays and TV-screens, a SiAlON-based fluorescent material and a SCASN-based fluorescent material are preferably used singly or in combination. Also, for lighting applications, a YAG-based fluorescent material or a LAG-based fluorescent material and a SCASN-based fluorescent material or a CASN-based fluorescent material are preferably used in combination.

The sealing member may contain a light diffusing agent (barium sulfate, titanium oxide, aluminum oxide, silicon oxide, or the like).

The shape of the sealing member is not specifically limited, but in view of light luminous intensity distribution and directivity of the light emitted from the light emitting element, a concave lens shape or a convex lens shape is preferably employed. Of those, a hemispherical convex lens shape may be most suitably employed.

The sealing member may be disposed with its outer edge arranged on the covering layer, or in the opening of the covering layer.

As long as covering the light emitting element, the sealing member may not be directly in contact with the light emitting element and may have a space between the light emitting element, or the sealing member is arranged so that over the light emitting element, it contacts the light emitting element, but at the outer periphery of the light emitting element, it is not necessarily directly in contact with the covering layer and the wiring portions which constitutes the substrate member, and disposed via the resin layer to be described later.

Resin Member

A resin member is formed extending along the longitudinal direction on the substrate member. The resin member is arranged to be offset in the lateral direction of the two sealing members. More specifically, the resin member is arranged substantially parallel to the sealing members. That is, the resin member is arranged overlapping the two sealing members in the lateral direction. Further, the resin member is arranged in the lateral direction at a location overlapping with the gap between the two sealing members, and at least a portion of each of the two sealing members defining the gap in the longitudinal direction. In this manner, the resin member extends across the gap when viewed from a lateral direction. The resin member may be arranged overlapping a part of two sealing members in the longitudinal direction. The resin member may also be arranged overlapping three or more sealing members in the longitudinal direction. Accordingly, the resin member may overlap two or more gaps when viewed from the lateral direction.

The resin member may seal one or more light emitting elements of the second group, or may not seal any light emitting elements.

In the case where grooves described above between the plurality of grooves extend along the lateral direction, the resin member preferably intersects with the grooves in a plan view of the substrate member respectively. With this arrangement, with the use of the resin member, the substrate member can be prevented from bending along the grooves.

The resin member can be made of the similar materials as the sealing member as described above. That is, the resin member can be made of a material which has transparency to the light from the light emitting element and has light resistance and electrical insulation properties. The resin member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

In the light emitting device according to the embodiments, the resin member is located in the lateral direction a side of the gap between two sealing members. The both ends of the resin member is located in the lateral direction at a respective side of ends of the two sealing member. With this arrangement, the flexible substrate member can be appropriately held by the sealing member and the resin member, so that bending of the substrate member along the lateral direction can be prevented.

The light emitting device according to the embodiments of the present invention includes, as described above, a flexible substrate member which uses a flexible base member, and while maintaining/improving the performance such as brightness and operation life time etc., required in the conventional usage, a significant downsizing and reduction in weight can be realized. That is, the light emitting device according to the embodiments of the present invention at least includes a substrate member and a plurality of light emitting elements and sealing members, and can realize a weight of 1 g/cm² or less, preferably 0.7 g/cm² or less, 0.4 g/cm² or less, or 0.1 g/cm² or less. More preferably, even with related components, such as a terminal for furnishing an external power source, a protective element, a fuse, a resistance etc., necessary for operating the light emitting device as designed, a weight of 1 g/cm² or less can be realized, and more preferably 0.7 g/cm² or less, 0.4 g/cm² or less, or 0.1 g/cm² or less can be realized. Thus, a light emitting device of very small weight can be obtained.

From a different point of view, for example, in the use as an alternative to the straight-tube type fluorescent lamps, for example, about 90 to 120 light emitting elements (for example 100 light emitting elements) can be arranged at uniform intervals with respect to the substrate member of about 120 cm×1.5 cm area, or about 50 to 70 light emitting elements (for example 60 light emitting elements) can be arranged at uniform intervals with respect to the substrate member of about 60 cm×1.7 cm area, and in the light emitting devices having such conformations, a total weight of 10 g or less, preferably 9 g or less, 8 g or less, or 7 g or less can be realized. More preferably, even with related components, such as a terminal for connection with an external power source, a protective element, a fuse, a resistance etc., necessary for operating the light emitting device as designed, a weight of 10 g or less, more preferably 9 g or less, 8 g or less, or 7 g or less can be realized.

The embodiments according to the present invention will be described below with reference to the drawings.

EMBODIMENTS

Figure 2:
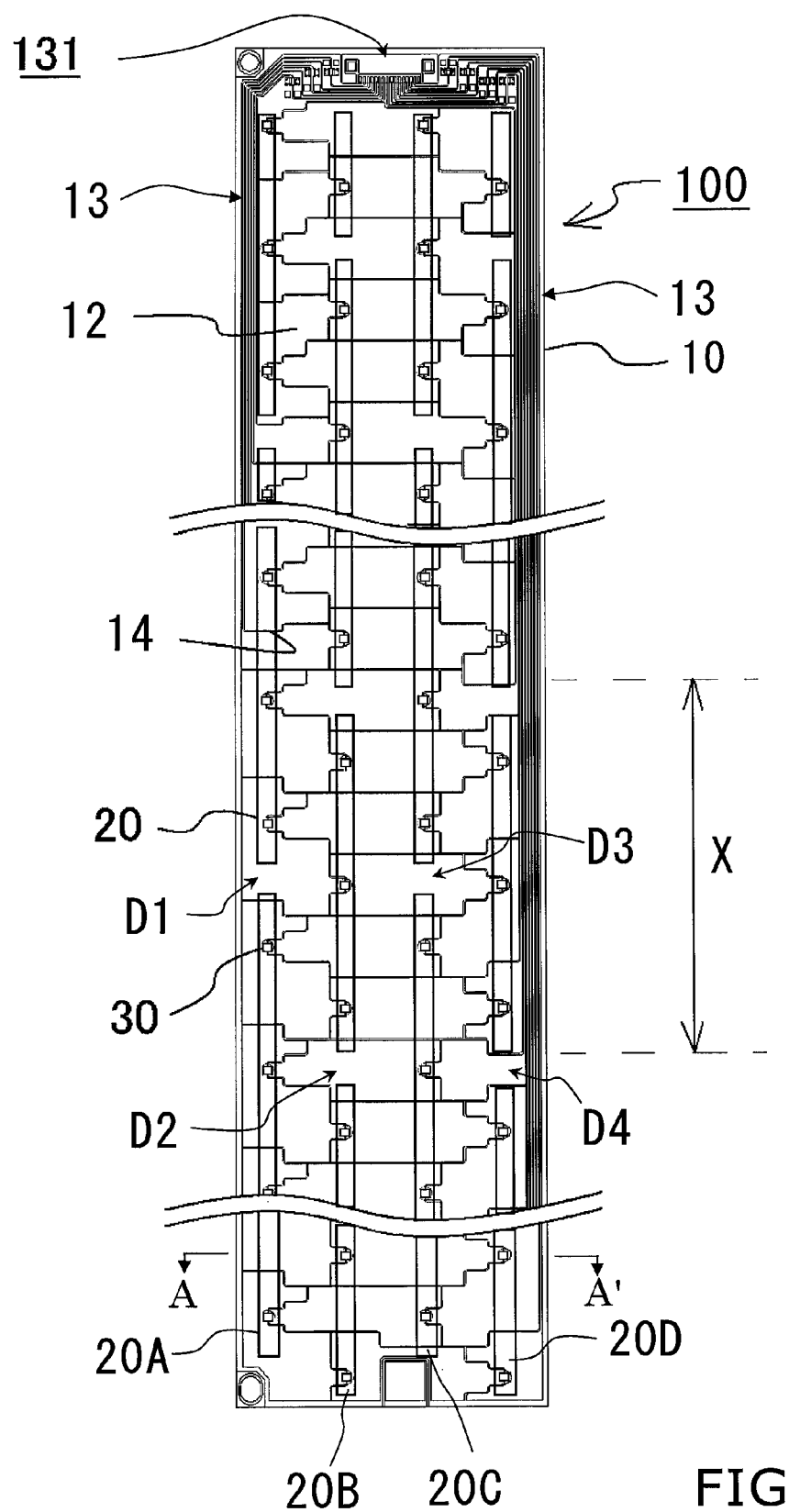
FIG. 2 is a schematic plan view showing a light emitting device according to an embodiment of the present invention.

The light emitting device 100 according to the present includes, as shown in FIG. 1 and FIG. 2, the substrate member 10, a plurality of light emitting elements 30 arranged on the surface of the substrate member 10, and a plurality of sealing members 20 which are arranged on the substrate member 10.

The substrate member 10 has a stacked layer structure made up of a flexible base member 11 made of a polyimide (about 25 μm thickness), a plurality of wiring portions 12 (copper foil, about 35 μm thickness) arranged on one surface of the base member 11 and spaced apart from each other by a groove 14, and an insulating covering layer 15 (about 15 μm thickness and made of an epoxy-based resin containing titanium oxide) disposed over them, which are stacked via an adhesive agent (an epoxy-based adhesive agent). Of the wiring portions 12, the wiring portion 13 extending in the longitudinal direction is connected to the terminal 131 which allows supply of electricity to the wiring portion 12.

The substrate member 10 has a size (area of 538.42 cm²) of 679.4 mm (length)×79.25 mm (width)×0.09 mm (thickness).

In order to establish electrical connection with the light emitting element 30, a groove 14 between the wiring portions 12 and the wiring portion 12 are exposed from the covering layer 15 through the openings in a region of the substrate member 10.

The wiring portion 12 is made into a shape with a plurality of step-wise bend portions in the lateral direction and also in the longitudinal direction. Accordingly, the wiring portion 12 is made into crank-like shapes with a plurality of recessed portions and protruded portions in a top view. The groove has a width of about 0.3 mm. This indicates that the wiring portions 12, 13 are arranged with a total area of about 85% with respect the whole area of the substrate member.

The light emitting element 30 includes a semiconductor structure, a p-side electrode, and an n-side electrode. In the semiconductor structure, the p-type semiconductor layer and the light emitting layer are partially removed to expose the n-type semiconductor layer, and an n-side electrode is formed on the exposed surface. A p-side electrode is formed on the upper surface of the p-type semiconductor layer. Thus, the n-side electrode and the p-side electrode are formed on the same surface side with respect to the semiconductor structure.

The light emitting element 30 as described above is arranged on a pair of the wiring portions 12 which are exposed from the coating layer 15 of the substrate member 10, with the surface having the n-side electrode and the p-side electrode facing downward, and is electrically connected to the wiring portions via the bonding member 35.

The light emitting elements 30 are arranged such that, for example, in a region indicated by X in FIG. 2, 12 light emitting elements 30 are arranged in series, and further, 5 in-series arrangements are arranged in parallel, thus, a total of 84 light emitting elements are arranged. The plurality of light emitting elements 30 are, as shown in FIG. 2, arranged in four rows along the longitudinal direction. The light emitting elements 30 of the first row and the third row are positioned at the same level in the longitudinal direction, and the light emitting elements 30 of the second row and the fourth row are positioned at the same level in the longitudinal direction.

The resin layer 40 is arranged on the upper surface of the substrate member 10 around the region where the light emitting element 30 is disposed and a part of the region directly under the light emitting element 30. The resin layer 40 is, for example, made of a silicone resin containing about 30 weight % of titanium oxide.

The resin member 40 is arranged from the outer edge of the light emitting element 30 and on the bonding member 35 to the outer periphery of the light emitting element, on the all portion in the opening and further onto a part of the covering layer 15. The thickness of the resin layer 40 can be approximately the same as the height of the light emitting element 30 at the light emitting element 30 side, and can be gradually reduced on the bonding member 35 to reach about 10 μm thickness on the covering layer 15. The length of the resin layer 40 from the end portion of the light emitting element 30 side to the end portion of the opposite side is about 1 mm.

In the case where the resin layer 40 is arranged at the outer periphery of the light emitting element 30 with a relatively large area, the sealing member 20 can be in contact with the resin layer 40 at a large contact area, so that the sealing member 20 can be firmly adhered to the substrate member 10. Further, the resin layer 40 has a reflectance higher than that of the bonding member 35 and the wiring portion 12, so that extraction of light from the light emitting element can be performed more efficiently.

The sealing member 20 is disposed on the substrate member 10 mounted with the light emitting element 30, on the portions including the light emitting element 30, the resin layer 40 arranged around the light emitting element 30, and a portion of the covering layer 15 disposed from directly under the resin layer 40 on the covering layer 15 arranged on an outer side of the light emitting element 30. The sealing member 20 is, for example, made of a silicone resin containing a total of about 10 weight % of fluorescent materials (LAG and•SCASN). That is, the sealing member 20 contains the same type of polymer used to make the resin layer.

The sealing member 20 is formed in a linear shape by applying such as line coating or printing. Line coating is a technique in which a predetermined amount of resin is discharged from a moving dispenser to form a resin layer in a continuous line shape. The height of the sealing member 20 is, for example, about 3.5 mm.

The sealing member 20 is disposed containing the same base polymer as in the resin layer 40, thus, the adhesion between the sealing member 20 and the resin layer 40 can be secured. Particularly, in the light emitting device 100, the resin layer 40 and the sealing film 15 are in contact with each other with the entire surface of the resin layer 40 and all the side surfaces of the resin layer 40 arranged on the covering layer 15, and thus, a further contact area between the resin layer 40 and the sealing member 20 can be secured. Moreover, the resin layer 40 and the sealing member 20 are arranged with containing the same base polymer, so that good suitability and compatibility between the resin layer 40 and the sealing member 20 can be obtained and thus further firm adhesion can be realized.

The plurality of sealing members 20 include a plurality of first covering layer 20A, a plurality of second sealing members 20B, a plurality of third sealing members 20C, and a plurality of fourth sealing members 20D. In the present embodiment, at least one of the first to the fourth sealing members 20A to 20D is an example of "sealing member" and at least one of the first to the fourth sealing members 20A to 20D is an example of "resin member".

More specifically, the first sealing member 20A serves as a "resin member" to prevent the base member 10 from bending between two second sealing members 20B. The second sealing member 20B serves as a "resin member" to prevent the base member 10 from bending between two first sealing members 20A. In a similar manner, the second sealing member 20B serves as a "resin member" to prevent the base member 10 from bending between two third sealing members 20C. The third sealing member 20C serves as a "resin member" to prevent the base member 10 from bending between two second sealing members 20B. The above can be applied in a similar manner between the third sealing member 20C and the fourth sealing member 20D.

The plurality of first sealing members 20A respectively seals the light emitting elements 30 of a first row. The plurality of second sealing members 20B respectively seals the light emitting elements 30 of a second row. The plurality of third sealing members 20C respectively seals the light emitting elements 30 of a third row. The plurality of fourth sealing members 20D respectively seals the light emitting elements 30 of a fourth row. The plurality of first sealing members 20A and the plurality of third sealing members 20C are positioned at the same level in the longitudinal direction. The plurality of second sealing members 20B and the plurality of fourth sealing members 20D are positioned at the same level in the longitudinal direction.

The first gap D1 formed between adjacent two first sealing members 20A is located in the lateral direction at a side of the second sealing member 20B. The second gap D2 formed between adjacent two second sealing members 20B is located in the lateral direction at a side of the first sealing member 20A and the third sealing member 20C. That is, the second gap D2 is located in the lateral direction between the first sealing member 20A and the third sealing member 20C. The third gap D3 formed between adjacent two third sealing members 20C is located in the lateral direction at a side of the second sealing member 20B and the fourth sealing member 20D. That is, the third gap D3 is located in the lateral direction between the second sealing member 20B and the fourth sealing member 20D. The fourth gap D4 formed between adjacent two first sealing members 20D is located in the lateral direction at a side of the second sealing member 20C.

The first to fourth sealing members 20A to 20D are respectively arranged in the lateral direction at a side of a gap between adjacent sealing members. The both ends of the first to fourth sealing members 20A to 20D are respectively arranged in the lateral direction at a side of an end of adjacent sealing members. More specifically, the second sealing members 20B are respectively arranged in the lateral direction at a side of a first gap D1 formed between the two first sealing members 20A. Both ends of the second sealing members 20B are arranged in the lateral direction at a side of the two first sealing members 20A respectively.

Moreover, the surfaces and the interface between the bonding member 35 and the wiring portion 12 and the interface between the wiring portion 12 and the reflective layer 15 can be covered with the resin layer 40, so that optical degradation of those members and detachment or the like, due to the optical degradation can be effectively prevented.

Five light emitting devices having the structure as described above were prepared and the total weight of the five light emitting devices was measured. The obtained total weight was then divided by five to obtain a total weight of one light emitting device. As a result, 21.84 g was obtained. Accordingly, the light emitting device has a weight of 0.04 g/cm$^2$ and the light emitting elements are arranged at a density of 0.16 light emitting elements/cm$^2$.

Also, the brightness of the light emitting device 100 was about 9,000 lm at a color temperature of 20,000 K.

In the light emitting device, the first gap D1 is arranged in the lateral direction at a side of the second sealing member 20B, so that the substrate member 10 can be appropriately held by the first sealing member 20A and the second sealing member 20B. Accordingly, the substrate member 10 can be prevented from bending along the lateral direction. Such an effect can also be obtained by arranging the second gap D2 at a side of the third sealing member 20C and/or the third gap D3 at a side of the fourth sealing member 20D.

The light emitting device according to the embodiments of the present invention can realize a significant downsizing and reduction in weight along with improvements in the performance (brightness etc.) and operation life time etc., compared to that of the conventional cold-cathode tubes or the like. As a result, the light emitting device can be applied across a wider range of various conformations and applications.

The wiring portions 12, 13 are to cover 50% or greater upper surface of the base member 11. The longitudinal length of the substrate member 10 to be 5 times or greater and 200 times or less with respect to the lateral length of the substrate member 10.

In the light emitting devices, a plurality of the light emitting elements 30 are arranged in four rows, but not limited thereto. The plurality of light emitting elements 30 may be arranged in a single row. In this case, a single row of the sealing member 20 is arranged to seal a plurality of the light emitting elements 30, and a resin member is arranged at a longitudinal side of the single row of the sealing member 20. Even in this case, the resin member is located at a side of the gap between the two sealing members, and the both ends of the resin member are located a side of the end of each of two sealing members, so that the substrate member can be prevented from bending along the lateral direction.

As described above, it should be obvious that various other embodiments are possible without departing the spirit and scope of the present invention. Accordingly, the scope and spirit of the present invention should be limited only by the following claims.

INDUSTRIAL APPLICABILITY

The light emitting device according to the present invention can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

As illustrated above, embodiments are described to give a concrete form to technical ideas of a method of manufacturing light emitting element according to the present invention, the present invention is not limited to the described embodiments of the present invention. Also, obviously, numerous modifications and variations of the present invention are possible in light of the above teachings, which are within the scope and spirit of the invention, and such other modifications and variations are intended to be covered by the following claims.

What is claimed is:

1. A light emitting device comprising:
a substrate member extending in a longitudinal direction, the substrate member including
 a flexible base member, and
 a plurality of sheet-shaped wiring portions arranged on the base member with a groove being defined between the plurality of sheet-shaped wiring portions;
a plurality of light emitting elements arranged over the groove on the substrate member;
at least two sealing members, the sealing members:
 being arranged on the substrate member extending in-line along the longitudinal direction,
 defining a gap in between two sealing members, and
 each of the sealing members seals at least one light emitting element; and
at least one resin member, the resin member:
 being arranged on the substrate member extending along the longitudinal direction, substantially parallel to the sealing members, and
 comprising a resin having transparency to light;
wherein the resin member is disposed such that it overlaps the gap and at least a portion of each of the two sealing members defining the gap in the longitudinal direction, and extends across the gap when viewed from a lateral direction perpendicular to the longitudinal direction.

2. The light emitting device according to claim 1, wherein:
the resin member seals at least one light emitting element among the plurality of light emitting elements.

3. The light emitting device according to claim 1, wherein:
the groove extends along the lateral direction and is arranged to intersect with at least the resin member and one of the sealing members.

4. The light emitting device according to claim 1, wherein:
the sealing members and the resin member seal at least two of the light emitting elements.

5. A light emitting device comprising:
a substrate member extending in a longitudinal direction;
a plurality of light emitting elements arranged on the substrate member;
at least two sealing members, the sealing members:
 being arranged on the substrate member extending in-line along the longitudinal direction,
 defining a gap in between two sealing members, and
 each of the sealing members seals at least one light emitting element; and
at least one resin member, the resin member:
 being arranged on the substrate member extending along the longitudinal direction, substantially parallel to the sealing members, and
 comprising a resin having transparency to light;
wherein the resin member is disposed such that it overlaps the gap and at least a portion of each of the two sealing members defining the gap in the longitudinal direction, and extends across the gap when viewed from a lateral direction perpendicular to the longitudinal direction,
a weight density is equal to the combined weights, per 1 $cm^2$ of a main surface of the substrate member, of:
 the substrate member,
 the plurality of light emitting elements,
 the sealing members, and
 the resin member; and
the weight density is less than or equal to 0.1 $g/cm^2$.

6. The light emitting device according to claim 1, wherein:
a light density is a number of the plurality of light emitting elements, per 1 $cm^2$ of a main surface of the substrate member, and
the light density is greater than or equal to 0.05, and less than or equal to 10.

7. The light emitting device according claim 1, wherein:
a brightness of the plurality of light emitting elements is 900 lm or greater at a color temperature of 5000 K.

8. The light emitting device according to claim 1, wherein:
the substrate member further comprises:
 a covering layer disposed on the plurality of sheet-shaped wiring portions;
the covering layer defines a plurality of openings exposing a part of each of the plurality of sheet-shaped wiring portions; and
the plurality of sheet-shaped wiring portions cover 50% or more of a main surface of the base member.

9. The light emitting device according to claim 1, wherein:
the substrate member has a longitudinal length and a lateral width; and
the longitudinal length is:
 greater than or equal to 5 times the lateral width, and
 less than or equal to 200 times the lateral width.

10. A light emitting device comprising:
a substrate member extending in a longitudinal direction, the substrate member including
 a flexible base member, and
 a plurality of sheet-shaped wiring portions arranged on the base member with a groove being defined between the plurality of sheet-shaped wiring portions;
a plurality of light emitting elements arranged over the groove on the substrate member;
at least two sealing members, the sealing members:
 being arranged on the substrate member extending in-line along the longitudinal direction,
 defining a first gap in between two sealing members, and
 each of the sealing members sealing at least one light emitting element; and
at least two resin members, the resin members:
 being arranged in-line on the substrate member extending along the longitudinal direction, substantially parallel to the sealing members, and
 defining a second gap between two resin members;
wherein at least one resin member is disposed such that it overlaps the first gap and at least a portion of each of the sealing members defining the gap in the longitudinal direction, and extends across the first gap when viewed from lateral a direction perpendicular to the longitudinal direction, and at least one sealing member is disposed such that it overlaps the second gap and at least a portion of each of the resin members defining the gap in the longitudinal direction, and extends across the second gap when viewed from a lateral direction perpendicular to the longitudinal direction.

11. The light emitting device according to claim 10, wherein:
the each resin member seals at least one light emitting element among the plurality of light emitting elements.

12. The light emitting device according to claim 10, wherein:
the groove extends along the lateral direction and is arranged to intersect with at least the resin member and one of the sealing members.

13. The light emitting device according to claim 10, wherein:
the sealing members and the resin members seal at least two of the light emitting elements.

14. The light emitting device according to claim 10, wherein:
a weight density is equal to the combined weights, per 1 cm² of a main surface of the substrate member, of:
the substrate member,
the plurality of light emitting elements,
the sealing members, and
the resin members; and
the weight density is less than or equal to 0.1 g/cm².

15. The light emitting device according to claim 10, wherein:
a light density is a number of the plurality of light emitting elements, per 1 cm² of a main surface of the substrate member, and
the light density is greater than or equal to 0.05, and less than or equal to 10.

16. The light emitting device according claim 10, wherein:
a brightness of the plurality of light emitting elements is 900 lm or greater at a color temperature of 5000 K.

17. The light emitting device according to claim 10, wherein:
the substrate member further comprises:
a covering layer disposed on the plurality of sheet-shaped wiring portions;
the covering layer defines a plurality of openings exposing a part of each of the plurality of sheet-shaped wiring portions; and
the plurality of sheet-shaped wiring portions cover 50% or more of a main surface of the base member.

18. The light emitting device according to claim 10, wherein:
the substrate member has a longitudinal length and a lateral width; and
the longitudinal length is:
greater than or equal to 5 times the lateral width, and
less than or equal to 200 times the lateral width.

19. The light emitting device according to claim 1, further including:
a third sealing member, the sealing members:
being arranged on the substrate member extending in-line along the longitudinal direction,
defining a first gap in between two sealing members,
defining a second gap between two sealing members,
each of the sealing members sealing at least one light emitting element; and
wherein the resin member is disposed such that it overlaps the first gap, the second gap, and at least a portion of each of the three sealing members defining the gaps in the longitudinal direction, and extends across the first gap and second gap when viewed from a lateral direction perpendicular to the longitudinal direction.

20. The light emitting device according to claim 10, wherein:
the at least two sealing members includes three sealing members, the sealing members:
being arranged on the substrate member extending in-line along the longitudinal direction,
defining the first gap in between two sealing members,
defining a third gap between two sealing members,
each of the sealing members sealing at least one light emitting element; and
wherein the resin members are disposed such that they overlap the first gap, the third gap, and at least a portion of each of the three sealing members defining the gaps in the longitudinal direction, and extends across the first gap and third gap when viewed from a lateral direction perpendicular to the longitudinal direction.

* * * * *